United States Patent
Li et al.

(10) Patent No.: US 7,288,284 B2
(45) Date of Patent: Oct. 30, 2007

(54) POST-CLEANING CHAMBER SEASONING METHOD

(75) Inventors: Lih-Ping Li, Hsinchu (TW); Yung-Chen Lu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 10/810,912

(22) Filed: Mar. 26, 2004

(65) Prior Publication Data

US 2005/0214455 A1    Sep. 29, 2005

(51) Int. Cl.
*B05D 7/22*   (2006.01)
*H05H 1/24*   (2006.01)

(52) U.S. Cl. .................. 427/237; 427/249.15; 427/578

(58) Field of Classification Search ................ 427/534, 427/237, 239, 249.15, 255.28, 255.37, 255.394, 427/578; 134/1.1, 1.2, 22.1; 438/905
See application file for complete search history.

(56) References Cited

U.S. PATENT DOCUMENTS

| | | | | |
|---|---|---|---|---|
| 5,061,514 A | * | 10/1991 | Boeglin | 427/578 |
| 5,629,043 A | * | 5/1997 | Inaba et al. | 427/79 |
| 5,811,356 A | * | 9/1998 | Murugesh et al. | 438/711 |
| 5,812,403 A | * | 9/1998 | Fong et al. | 700/121 |
| 5,824,375 A | * | 10/1998 | Gupta | 427/569 |
| 5,891,799 A | * | 4/1999 | Tsui | 438/624 |
| 6,020,035 A | * | 2/2000 | Gupta et al. | 427/534 |
| 6,042,887 A | * | 3/2000 | Chien et al. | 427/255.37 |
| 6,121,161 A | * | 9/2000 | Rossman et al. | 438/783 |
| 6,136,211 A | * | 10/2000 | Qian et al. | 216/37 |
| 6,274,058 B1 | * | 8/2001 | Rajagopalan et al. | 216/67 |
| 6,323,119 B1 | * | 11/2001 | Xi et al. | 438/627 |
| 6,403,501 B1 | * | 6/2002 | Hander et al. | 438/783 |
| 6,479,098 B1 | * | 11/2002 | Yoo et al. | 427/237 |
| 6,756,088 B2 | * | 6/2004 | Sharan | 427/569 |
| 6,890,850 B2 | * | 5/2005 | Lee et al. | 438/631 |
| 6,974,781 B2 | * | 12/2005 | Timmermans et al. | 438/794 |
| 2002/0170487 A1 | * | 11/2002 | Zehavi et al. | 117/84 |
| 2003/0013314 A1 | * | 1/2003 | Ying et al. | 438/710 |
| 2003/0143410 A1 | * | 7/2003 | Won et al. | 428/448 |
| 2003/0220708 A1 | * | 11/2003 | Sahin et al. | 700/121 |
| 2005/0214454 A1 | * | 9/2005 | Yang et al. | 427/248.1 |

FOREIGN PATENT DOCUMENTS

EP      1154037 A1   *  11/2001

* cited by examiner

*Primary Examiner*—Timothy Meeks
*Assistant Examiner*—David Turocy
(74) *Attorney, Agent, or Firm*—Tung & Associates

(57) ABSTRACT

A method for seasoning a process chamber is disclosed. The seasoning method includes providing a seasoning film on the interior surfaces of a process chamber, typically after cleaning of the chamber.

7 Claims, 2 Drawing Sheets

POST-CLEANING CHAMBER SEASONING METHOD

FIELD OF THE INVENTION

The present invention relates to chemical vapor deposition (CVD) technology used in the deposition of material layers such as polysilicon in the fabrication of integrated circuits on a semiconductor wafer substrate. More particularly, the present invention relates to a novel post-cleaning seasoning method for the seasoning of a CVD chamber in order to reduce the quantity of residual particles remaining in the chamber.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include sequential deposition of conductive and insulative layers on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove material from one or more conducting layers from the areas not covered by the mask, thereby etching the conducting layer or layers in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. Additional techniques, such as dual damascene processes, are used to form conductive vias which establish electrical contact between vertically-spaced conductive lines or layers in the circuits. The finished semiconductor product includes microelectronic devices including transistors, capacitors and resistors that form the integrated circuits on each of multiple die on a single wafer.

In the semiconductor industry, CMOS (complementary metal-oxide semiconductor) technology is extensively used in the fabrication of IC devices. CMOS technology typically involves the use of overlying layers of semiconductor material with the bottom layer being a dielectric layer and the top layer being a layer of doped silicon material that serves as a low-resistivity electrical contact gate electrode. The gate electrode, also referred to as a gate stack, typically overlies the dielectric layer.

In the semiconductor fabrication industry, silicon oxide ($SiO_2$) is frequently used for its insulating properties as a gate oxide or dielectric. As the dimensions of device circuits on substrates become increasingly smaller, the gate dielectric thickness must decrease proportionately in field effect transistors (FETs) to approximately 3 to 3.5 nonometers. Accordingly, device performance and reliability can be adversely affected by such factors as interfacial defects, defect precursors and diffusion of dopants through gate dielectrics, as well as unintended variations in thickness in the gate oxide layer among central and peripheral regions of the layer.

Two types of CMOS device structures which are commonly fabricated in semiconductor technology include the MOSCAP (metal oxide semiconductor capacitor) structure and the MOSFET (metal oxide semiconductor field effect transistor) structure. Both of these structures include a substrate on which is deposited a dielectric layer having a high dielectric constant (k), such as a pad oxide layer. A silicon-containing gate, or gate stack, is deposited on the dielectric layer and connects a pair of trench oxide layers (in the case of a MOSCAP structure) or source and drain regions (in the case of a MOSFET structure).

One gate stack fabrication technique involves the deposition of polycrystalline silicon (polysilicon) on the high-k dielectric layers of multiple substrates simultaneously in a vertical process furnace to form the gate stack on each substrate. Such a deposition process requires a relatively high thermal budget (620 degrees C. at a process time of typically about 1.5 hours). Another technique involves the deposition of amorphous silicon on the dielectric layer in a process furnace to form the gate stack on each of the multiple substrates. Compared to the polysilicon deposition process, the deposition of amorphous silicon has a lower thermal budget (550 degrees C. at a process time of typically about 2 hours). Therefore, due to the relatively lower thermal budget of the amorphous silicon deposition process in the furnace processing of multiple substrates, amorphous silicon has a higher stability than polysilicon when deposited as a gate stack on a dielectric layer having a high dielectric constant.

Formation of a gate stack on a pad oxide layer in fabrication of both the MOSCAP and MOSFET structures is currently carried out typically on single substrates using chemical vapor deposition (CVD) in a CVD process chamber. In the fabrication of MOSCAP and MOSFET structures, polysilicon or amorphous silicon is deposited on a high-k dielectric layer in a CVD process chamber. Polysilicon is deposited on the dielectric layer at a temperature of typically about 675 degrees C. for a process time of about 1 minutes. Amorphous silicon, on the other hand, is deposited on the dielectric layer at a temperature of typically about 575 degrees C. for about 10 min. This is accomplished by reacting hafnium dioxide ($HfO_2$) with silicon (Si) to form silicon oxides (SiOx), according to the following equation:

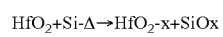

$$HfO_2 + Si\text{-}\Delta \rightarrow HfO_2\text{-}x + SiOx$$

Ideally, the silicon oxides are deposited in an even layer over the high-k dielectric layer to form the high-stability gate stack structure. However, it has been found that in spite of the lower thermal budget of the amorphous silicon deposition process, the amorphous silicon is less stable than the polysilicon in single-wafer processing applications due to unintended chemical reactions between the hafnium dioxide and cleaning agent used to clean the process chamber.

During gate stack fabrication or other extended use of the CVD chamber in semiconductor fabrication, some of the silicon oxide or other high molecular weight residues accumulate on the interior surfaces of the process chamber. Because these residues are loosely attached to the chamber wall interior surfaces, the residues have a tendency to break off and contaminate device structures being fabricated on the wafer. Accordingly, at regular intervals, the CVD process chamber must be subjected to a chamber-cleaning procedure to remove the residues of silicon oxides from the interior chamber walls.

To prevent accumulation of excessive quantities of residues inside a CVD chamber, the chamber is dry-cleaned after a predetermined period of operation such that microparticles attached to the interior sidewalls of the chamber are removed. After longer periods of operation, preventative maintenance (PM) of the chamber is carried out to restore the reaction chamber to ideal operating conditions.

Even after regular dry-cleaning and PM cleanings of the CVD chamber are carried out, some residual particles frequently remain attached to the interior surfaces of the chamber. Accordingly, a novel chamber seasoning method is needed to provide a seasoning film on the interior surfaces of a CVD chamber in order to minimize the accumulation of residual particles in the chamber during chemical vapor deposition processes.

An object of the present invention is to provide a novel method for the seasoning of a process chamber in such a manner as to enhance the quality of device features fabricated on substrates in the chamber.

Another object of the present invention is to provide a novel chamber seasoning method which includes providing a seasoning film on the interior surfaces of a process chamber to prevent the excessive accumulation of particles in the chamber.

Still another object of the present invention is to provide a novel chamber cleaning method which is particularly adapted for a CVD chamber but may be adapted to a variety of process chambers for a variety of semiconductor fabrication or other processes.

Yet another object of the present invention is to provide a novel chamber cleaning method which improves the stability of films deposited on a substrate.

A still further object of the present invention is to provide a novel chamber seasoning method which may be carried out after a chamber-cleaning process and includes deposition of an oxygen-rich seasoning film on the interior surfaces of a CVD chamber.

Another object of the present invention is to provide a novel chamber seasoning method which is effective in reducing the quantity of defects in devices fabricated on a wafer and increasing the WAT (wafer acceptance testing) yield.

SUMMARY OF THE INVENTION

In accordance with these and other objects and advantages, the present invention is generally directed to a novel method for seasoning a process chamber in such a manner that the quantity of particulate residues remaining in the chamber after semiconductor fabrication or other processes are carried out in the chamber, is substantially reduced. The seasoning method includes providing a seasoning film on the interior surfaces of a process chamber, typically after cleaning of the chamber. Accordingly, the quantity of particulate by-product residues which remain in the chamber after processing is substantially reduced.

According to a typical embodiment of the invention, the seasoning film formed on the interior surfaces of the process chamber is a silicon dioxide ($SiO_2$) film. The seasoning film may be formed on the chamber walls by introducing a silicon-containing gas such as silane ($SiH_4$), and an oxygen-containing precursor gas such as molecular oxygen ($O_2$), into the chamber and reacting the silicon-containing gas with the oxygen-containing precursor gas to form the silicon dioxide seasoning film on the interior surfaces of the chamber. Other oxygen-containing precursor gases which are suitable for carrying out the present invention include $N_2O$, NO and $CO_2$, for example.

In another embodiment, dichlorosilane ($SiCl_2H_2$) gas is reacted with ammonia ($NH_3$) to form a silicon nitride seasoning film on the interior surfaces of the chamber. In still another embodiment, trimethylsilane [$Si(CH_3)_3H$] is used as the silicon precursor source gas for deposition of a silicon carbide seasoning film on the interior chamber surfaces.

BRIEF DESCRIPTION OF THE DRAWINGS

The invention will now be described, by way of example, with reference to the accompanying drawings, in which.

DETAILED DESCRIPTION OF THE INVENTION

The present invention has particularly beneficial utility in the seasoning of chemical vapor deposition (CVD) chambers used to form material layers in semiconductor fabrication, such as to deposit a silicon-containing layer on a high-k dielectric layer in the fabrication of gate stack structures on semiconductor wafer substrates, for example. However, the invention is not so limited in application and is equally applicable to semiconductor IC fabrication processes in general as well as other industrial processes.

The present invention contemplates a method which includes providing a seasoning film of high oxygen content on the interior surfaces of a process chamber, particularly a CVD chamber. The seasoning film reduces the quantity of residual process particles which remain in the chamber after chemical vapor deposition processes are carried out in the chamber. This reduces the quantity of contaminating particles which are available to contaminate layers deposited on substrates in subsequent processes. Consequently, the incidence of defects in device features fabricated on substrates is substantially decreased, thereby promoting the WAT (wafer acceptance testing) yield.

The seasoning film is typically a silicon dioxide ($SiO_2$) layer which may be deposited on the interior surfaces of the chamber by reacting a silicon-containing gas with an oxygen-containing precursor gas in the chamber. Preferably, the seasoning film is formed on the interior chamber surfaces after a chamber cleaning process is carried out.

In one embodiment according to the method of the present invention, a silicon dioxide ($SiO_2$) seasoning film is formed on the interior surfaces of the process chamber by reacting silane ($SiH_4$) gas with molecular oxygen ($O_2$). Alternatively, the silicon dioxide seasoning film is formed by reacting silane with nitrous oxide ($N_2O$), nitric oxide (NO), carbon dioxide ($CO_2$) or any other suitable oxygen-containing precursor gas.

In another embodiment, dichlorosilane ($SiCl_2H_2$) gas is reacted with ammonia ($NH_3$) to form a silicon nitride ($Si_3N_4$) seasoning film on the interior surfaces of the chamber. In still another embodiment, trimethylsilane [$Si(CH_3)_3H$] is used as the silicon precursor source gas and carbon dioxide ($CO_2$) is used as the carbon precursor gas for deposition of a silicon carbide (SiC) seasoning film on the interior chamber surfaces.

In the various embodiments, the seasoning film may have a thickness of typically from about 2 μm to about 20 μm on the interior surfaces of a process chamber. Preferably, the seasoning film has a thickness of typically at least about 10 μm.

Typical process conditions for formation of the seasoning film are as follows: chamber temperature (about 500 to about 700 degrees C.); chamber pressure (about 10 Torr to about 760 Torr, or 1 atmosphere); and process time (about 0.5 min. to about 10 min.).

Figure 1:
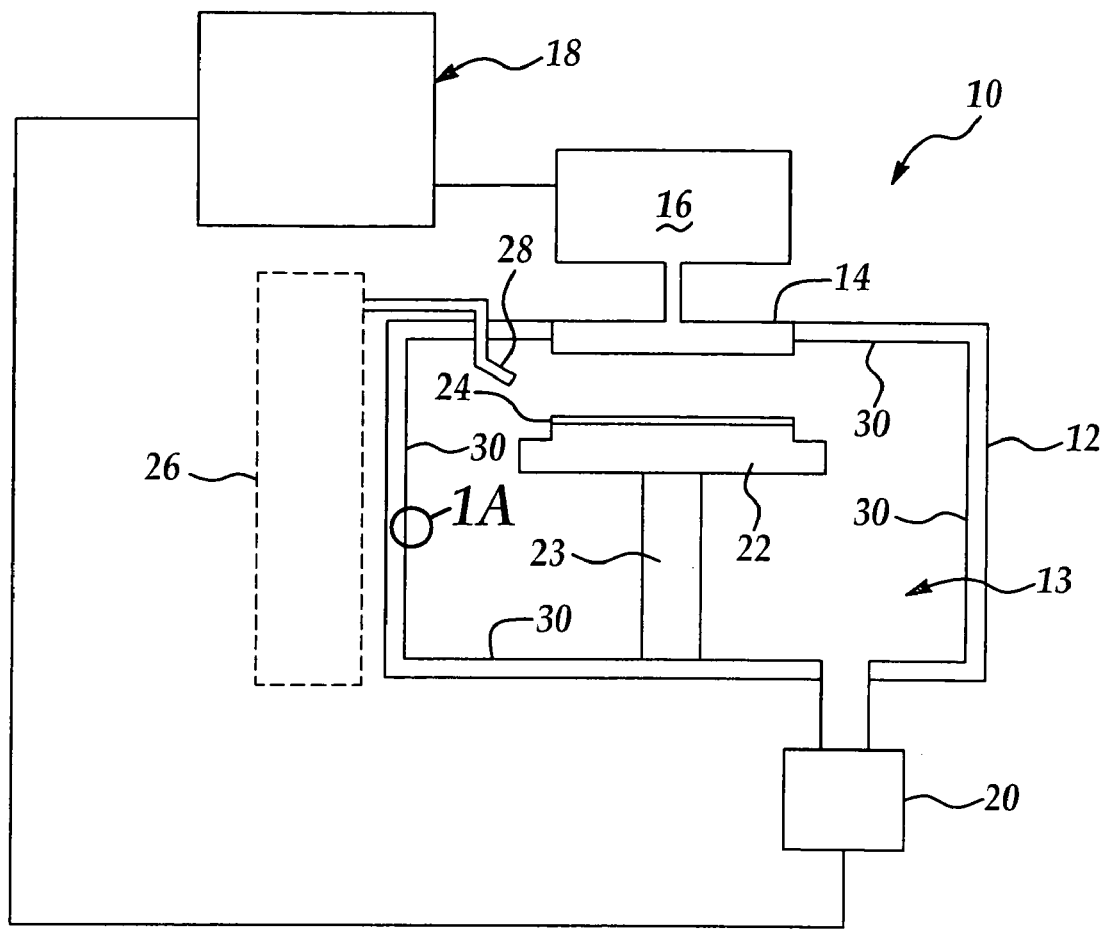
FIG. 1 is a schematic of a CVD process chamber in implementation of the method of the present invention.

Referring to FIG. 1, a typical CVD process chamber 10 suitable for implementation of the method of the present invention is shown. The chamber 10 includes a chamber wall 12 that defines a chamber interior 13. A gas distribution plate or "showerhead" 14 is provided in the top of the chamber 10 for the introduction of process gases from a gas panel 16 into the chamber interior 13, by actuation of a control unit 18. A vacuum pump 20 is provided in gas communication with the chamber interior 13 for the evacuation of gases therefrom. A pedestal support 23, on which is provided a pedestal 22 for supporting a substrate 24, is upward-standing in the chamber interior 13.

The chamber 10 may be further equipped with temperature control features used to control the temperature of the pedestal 22 and substrate 24 resting thereon, as is known by those skilled in the art. The showerhead 14 and the pedestal 22 also form a pair of spaced-apart electrodes. When an electric field is generated between the electrodes, the process gases introduced into the chamber 10 are ignited into a plasma.

Typically, the electric field is generated by connecting the pedestal 22 to a source of radio frequency (RF) power (not shown) through a matching network (not shown). Alternatively, the RF power source and matching network may be coupled to the showerhead 14 or to both the showerhead 14 and the pedestal 22. Optionally, a remote plasma source 26 may be provided in communication with the chamber interior 13 to provide a remotely-generated plasma to the chamber interior 13, typically through a chamber inlet 28 that extends into the chamber interior 13.

In typical operation of the CVD process chamber 10 to deposit a material layer or layers on a substrate 24, the substrate 24 is initially placed on the pedestal 22. Deposition gases are introduced into the chamber interior 13 through the showerhead 14 and ignited to form a plasma which contacts the substrate 24 to deposit material layers thereon. In the fabrication of gate stack structures which are characteristic of MOSCAP (metal oxide semiconductor capacitor) structures and MOSFET (metal oxide semiconductor field effect transistor) structures, for example, amorphous silicon or polysilicon is deposited on a high-k dielectric material layer.

During the deposition process, silicon or other material residues become deposited on the interior surfaces, including those of the chamber wall 12, of the chamber 10. Typically, these silicon residues are removed by introducing etchant HCl or other etchant cleaning gas into the chamber interior 13 through the showerhead 14, such that the HCl or other etchant cleaning gas contacts the interior surfaces of the chamber 10 and removes the silicon residues from those surfaces to eliminate or minimize the risk of contaminating devices that are subsequently fabricated on substrates 24. However, the HCl or other etchant cleaning gas is typically incapable of removing all of the silicon or other material residues from the interior surfaces of the chamber 10.

Figure 1A:
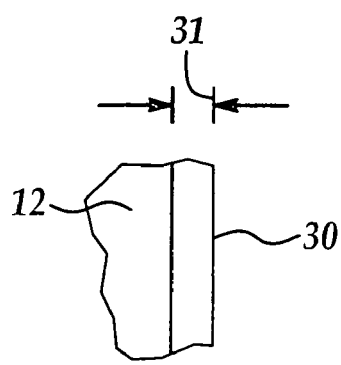
FIG. 1A is an enlarged sectional view, taken along section line 1A in FIG. 1, of a portion of a CVD process chamber wall and a seasoning film provided on the inner surface of the wall according to the method of the present invention.
Figure 2:
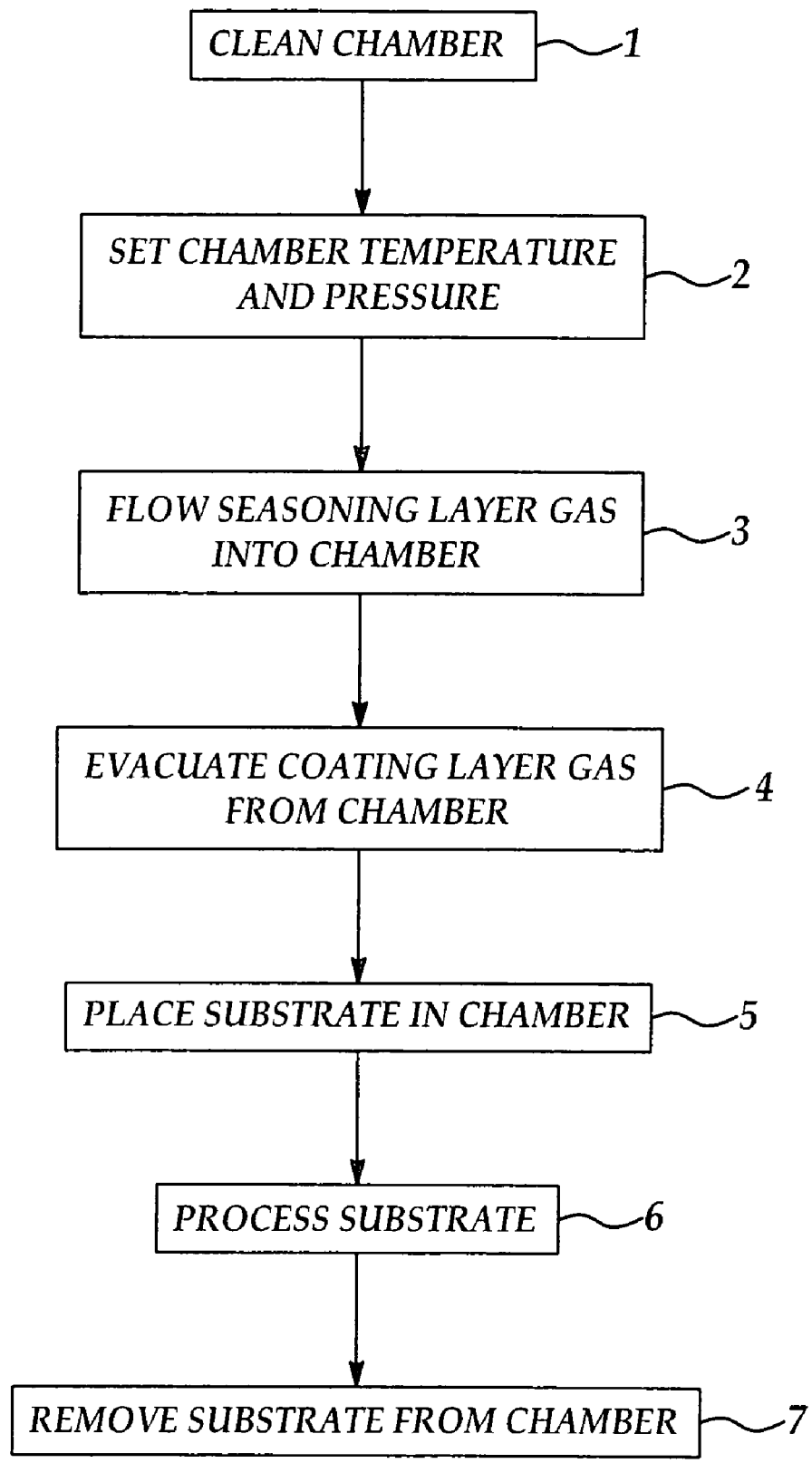
FIG. 2 is a process flow diagram which illustrates a typical process flow in implementation of the method of the present invention.

Referring to FIGS. 1, 1A and 2, in accordance with the method of the present invention, a seasoning film 30 is deposited on the interior surfaces of the process chamber 10, as follows. First, the chamber 10 is cleaned such as by using HCl or other etchant gas, as indicated in step 1 of FIG. 2 and according to the knowledge of those skilled in the art. Next, as indicated in step 2 of FIG. 2, the chamber 10 is initially set to the proper chamber temperature and pressure necessary for the layer-seasoning process. In typical application, the chamber 10 is set at a temperature of typically from about 500 degrees C. to about 700 degrees C. and a pressure of typically from about 10 Torr to about 760 Torr, or 1 atmosphere.

Next, as shown in step 3, the seasoning film precursor gases are introduced into the chamber interior 13, typically through the showerhead 14. In one embodiment, in which the seasoning film 30 is silicon dioxide ($SiO_2$), the silicon precursor gas is silane ($SiH_4$) and the oxygen precursor gas is $O_2$, $N_2O$, NO, $CO_2$ or other suitable oxygen-containing precursor gas. In another embodiment, in which the repellent coating layer 30 is silicon nitride ($Si_3N_4$), the silicon precursor gas is dichlorosilane ($SiCl_2H_2$) and the nitrogen precursor gas is ammonia ($NH_3$). In still another embodiment, in which the repellent coating layer 30 is silicon carbide (SiC), the silicon precursor gas is trimethylsilane [$Si(CH_3)_3H$] and the carbon precursor gas is carbon dioxide ($CO_2$)

The seasoning film precursor gases remain in the chamber interior 13 for a period of from typically about 0.5 min. to about 10 min., during which time the silicon dioxide, silicon nitride or silicon carbide coats the interior surfaces, including the chamber walls 12 and the showerhead 14, as the seasoning film 30. As shown in FIG. 1A, the seasoning film 30 preferably has a thickness 31 of typically from about 2 μm to about 10 μm.

As indicated in step 4 of FIG. 2, after the seasoning film 30 has been deposited on the interior surfaces of the chamber 10, layer-forming precursor gases and by-products which remain in the chamber 10 are evacuated therefrom typically by operation of the vacuum pump 20. Accordingly, the chamber 10 is seasoned or primed for CVD processing of substrates 24 therein, and a substrate 24 is placed on the pedestal 22, as shown in step 5, for processing, as shown in step 6. After completion of the CVD process, the substrate 24 is removed from the chamber 10, as shown in step 7.

During the CVD deposition process of step 5, the seasoning film 30 repels the formation of amorphous silicon and other material residues on the interior surfaces of the chamber 10. Therefore, after completion of the CVD deposition process, these residues are readily evacuated from the chamber 10 with the remaining process gases using the vacuum pump 20.

While the preferred embodiments of the invention have been described above, it will be recognized and understood that various modifications can be made in the invention and the appended claims are intended to cover all such modifications which may fall within the spirit and scope of the invention.

What is claimed is:

1. A method of seasoning a process chamber having interior surfaces to reduce the formation of silicon residues on said interior surfaces in a subsequent silicon plasma deposition process, comprising the steps of:
   cleaning said process chamber according to a cleaning process comprising a chlorine containing etchant to remove silicon residues from said chamber; and
   providing a seasoning film comprises silicon carbide on said interior surfaces of said process chamber by introducing precursor gases comprising trimethylsilane and carbon dioxide into said process chamber at a pressure of from about 10 Torr to about 760 Torr.

2. The method of claim 1, further comprising the step of depositing a silicon layer on a substrate within said chamber according to a plasma deposition process.

3. The method of claim 2, wherein said silicon comprises amorphous silicon.

4. A method of seasoning a chemical vapor deposition chamber having interior surfaces and a gas distribution plate to reduce the formation of silicon residues on said interior surfaces and said gas distribution plate in a subsequent silicon plasma deposition process, comprising the steps of:
   cleaning said chamber according to a cleaning process comprising a chlorine containing etchant gas to remove silicon residues from said chamber; and
   providing a seasoning film comprising silicon carbide having a thickness of from about 2 μm to about 10 μm on said interior surfaces and said gas distribution plate of said chamber by introducing precursor gases comprising trimethylsilane and carbon dioxide into said process chamber at a chamber pressure of from about 10 Torr to about 760 Torr at a temperature from about 500 degrees C. to about 700 degrees C.

5. The method of claim 4, further comprising the step of depositing a silicon layer on a substrate within said chamber according to a plasma deposition process.

6. A method of seasoning a chemical vapor deposition chamber having interior surfaces and a gas distribution plate to reduce the formation of silicon residues on said interior surfaces and said gas distribution plate in a subsequent silicon plasma deposition process, comprising the steps of:
   cleaning said chamber according to a cleaning process comprising a chlorine containing etchant gas to remove silicon residues from said chamber; and
   providing a seasoning film comprising silicon carbide having a thickness of from about 2 μm to about 10 μm on said interior surfaces and said gas distribution plate of said chamber comprising introducing precursor gases comprising trimethylsilane and carbon dioxide into said process chamber at a chamber pressure of from about 10 Torr to about 760 Torr at a temperature from about 500 degrees C. to about 700 degrees C. and a process time of from about 0.5 minutes to about 10 minutes.

7. The method of claim 6, further comprising the step of depositing a silicon layer on a substrate within said chamber according to a plasma deposition process.

* * * * *